United States Patent
Mazhar

(10) Patent No.: US 7,277,040 B2
(45) Date of Patent: Oct. 2, 2007

(54) ANALOG TO DIGITAL CONVERTER WITH PING-PONG ARCHITECTURE

(75) Inventor: Salman Mazhar, Golden Valley, MN (US)

(73) Assignee: DSP Group Inc., Santa Clara, CA (US)

( * ) Notice: Subject to any disclaimer, the term of this patent is extended or adjusted under 35 U.S.C. 154(b) by 0 days.

(21) Appl. No.: 11/390,991

(22) Filed: Mar. 28, 2006

(65) Prior Publication Data

US 2007/0001891 A1    Jan. 4, 2007

Related U.S. Application Data

(60) Provisional application No. 60/695,968, filed on Jul. 1, 2005.

(51) Int. Cl.
    *H03M 1/12* (2006.01)
(52) U.S. Cl. .................................................. 341/155
(58) Field of Classification Search ............... 341/155, 341/156, 161, 159, 141, 122, 118, 129, 143
    See application file for complete search history.

(56) References Cited

U.S. PATENT DOCUMENTS

| | | | |
|---|---|---|---|
| 6,785,529 B2 | 8/2004 | Ciccarelli et al. | |
| 6,943,720 B2 * | 9/2005 | Nakamori et al. | 341/156 |
| 7,088,278 B2 * | 8/2006 | Kurose et al. | 341/155 |
| 7,139,332 B2 * | 11/2006 | Yu et al. | 375/316 |
| 2003/0206603 A1 | 11/2003 | Husted | |

FOREIGN PATENT DOCUMENTS

GB    1388942 A2 * 11/2006
WO    WO 02/082673 A1  10/2002
WO    WO 03/001682 A2   1/2003

OTHER PUBLICATIONS

Behzad Razavi, "RF Microelectronics," Chapters 3, 4 and 5 (pp. 54-165) 1998.
Declaration Under 37 C.F.R. 1.132 of Salman Mazhar, dated Nov. 22, 2006, 2 pages.
Notification of Transmittal of the International Search Report and the Written Opinion of the International Searching Authority, or the Declaration for corresponding PCT Appl. No. PCT/US2006/024888, dated Nov. 28, 2006 (11 pgs.).
International Preliminary Examination Report from corresponding PCT Application Serial No. PCT/US2006/024888 mailed Jun. 15, 2007 (15 pages).

* cited by examiner

*Primary Examiner*—Brian Young
(74) *Attorney, Agent, or Firm*—Shumaker & Sieffert, P.A.

(57) ABSTRACT

The invention provides a receiver for use in a wireless communication system that substantially reduces mismatch between an in-phase (I) component and a quadrature (Q) component of a received signal. The receiver achieves this by sharing or "ping-ponging" an analog-to-digital converter (ADC) between the I and Q components. By sharing a single pipelined ADC between the I and Q components, both the I and Q components are processed by the same circuitry inside the pipelined ADC thereby eliminating many dominant sources of I-Q mismatch. The pipelined ADC operates at approximately twice the speed as other circuit components. Consequently, I-Q mismatch, which negatively affects performance, may be substantially reduced. At the same time, system complexity, cost, and power dissipation are reduced by eliminating an additional ADC typically used to process the I and Q components in parallel signal paths.

38 Claims, 9 Drawing Sheets

ANALOG TO DIGITAL CONVERTER WITH PING-PONG ARCHITECTURE

This application claims the benefit of U.S. Provisional Application No. 60/695,968, filed Jul. 1, 2005, the entire content of which is incorporated herein by reference.

TECHNICAL FIELD

The invention relates to analog-to-digital converters (ADC)s for use in wireless communication systems.

BACKGROUND

Modern radio frequency (RF) communication systems employ advanced signal modulation techniques to modulate the carrier frequency by a digital baseband signal. These techniques include, for example, Phase-Shift Keying (PSK), Binary Phase Shift Keying (BPSK), Quadrature Phase Shift Keying (QPSK), Frequency Shift Keying (FSK) and Minimum Shift Keying (MSK). The use of digital modulation techniques versus analog modulation techniques leads to improved system performance, lower cost, higher reliability, greater capacity and increased security. However, these improvements come at the price of increased system complexity, particularly in the design of radio transceivers.

The use of digital modulation techniques for transmitting data requires that subsequent demodulation of the received data take place in the digital domain. This allows the use of sophisticated digital signal processing (DSP) techniques to improve data reception in the presence of many real-world imperfections such as multipath interference, intersymbol interference, fading, and the like.

For data reception, the in-coming RF signal is received at the antenna, amplified, translated to a lower frequency, filtered and then converted from the analog domain to the digital domain for further processing and eventual demodulation. The receive path is split into two parallel paths during the frequency translation to baseband frequency. This step is typically carried out as a quadrature down-conversion resulting in both an in-phase (commonly referred to as channel I) and a quadrature (commonly referred to as channel Q) component of the in-coming receive data. Channels I and Q are subsequently processed simultaneously in two parallel, well-matched signal paths. By processing the signals in two parallel, well matched signal paths, unwanted by-product of the frequency translation or down mixing can be substantially cancelled when the two channels are re-combined in the digital domain. However, the effectiveness of this cancellation scheme is fundamentally limited by the amount of gain and phase mismatch in the two parallel signal paths I and Q, also referred to as I-Q mismatch.

Depending on the receiver architecture, e.g., heterodyne, homodyne, or image-reject, I-Q mismatch can substantially affect system performance. The amount of tolerable I-Q mismatch varies with the architecture. Typically, image-reject and homodyne systems are more sensitive than heterodyne systems. In any case, I-Q mismatch leads to incomplete cancellation of the image frequency when the channels are recombined in the digital domain. Incomplete cancellation of the image frequency degrades the signal-to-noise-ratio (SNR) in the desired frequency band and results in sub-optimal receiver performance.

The sources of mismatch between channels I and Q are many. For example, the gain and phase mismatch of the local oscillator contributes a mismatch term. In addition, each stage in the two parallel signal paths contributes to the overall mismatch. While some sources of mismatch are static, others can vary over time thereby making it more difficult to track and compensate for the mismatch. As an example, it may be particularly difficult to compensate for mismatch caused by ADCs in which the reference voltage mismatch changes as a function of operating temperature.

SUMMARY

In general, the invention is directed to a receiver for use in a wireless communication system. The receiver substantially reduces or eliminates mismatch between an in-phase (I) component and a quadrature (Q) component of a received signal. This is achieved by sharing or "ping-ponging" an analog-to-digital converter (ADC) between the analog I and Q components. By sharing a single pipelined ADC between the I and Q components, both the I and Q components are processed by the same circuitry inside the pipelined ADC, thereby eliminating many dominant sources of I-Q mismatch. Consequently, I-Q mismatch between the I and Q components, which negatively affects performance, may be substantially reduced. At the same time, system complexity and cost are reduced because rather than using separate ADCs to process the I and Q components, the receiver uses a single ADC to process the I and Q components.

For example, the receiver includes a data converter to convert the received signal from the analog domain to the digital domain for digital signal processing and demodulation. The data converter includes first and second sample-and-hold (S/H) circuits that simultaneously sample channels I and Q, respectively, a common pipelined ADC that processes both the I and Q components, and a multiplexer that applies one of the outputs of the S/H circuits to the common ADC at a given time. The ping-ponging of the common ADC between the I and Q components is achieved by the operation of the multiplexer. Because the receiver uses a single ADC to process the I and Q components, the common ADC operates at approximately twice the operating speed of the S/H circuits and multiplexer. However, I-Q mismatch is substantially reduced and a fifty percent reduction in area may be achieved because the I and Q components are both processed using the same circuitry inside a common pipelined ADC. To further reduce mismatch, the S/H circuits may also be positioned adjacent to each other on a circuit block. Clock routing may also be simplified because clock paths need only be matched locally without having to control clock skews between two independent ADCs. In this manner, the invention increases system performance while reducing system complexity, cost, power consumption, and die area.

The invention also may be extended to a 4-way ping-pong scheme and higher order ping-pong schemes, such as an 8-way ping-pong scheme, a 12-way ping-pong scheme, and the like. In some embodiments, a switch network may be included upstream of the ping-pong scheme to eliminate mismatch effects due to mismatch in the S/H circuits. With respect to the 4-way ping-pong scheme, the switch network may rotate which input signal is sampled by a S/H circuit. The switch network may rotate the input signals according to a random control sequence. In this case, the same random sequence is applied to the output demultiplexer block to separate individual signal streams.

In additional embodiments, the most significant bits (MSB)s of the received signal may be computed using parallel signal paths and the least significant bits (LSB)s may be computed by multiplexing onto a single pipeline. In this case, the analog I and Q components may be applied to a first and a second ADC, respectively, at the same time to compute the MSBs. The output of the first and second ADCs may be multiplexed onto a common ADC that computes the LSBs. Consequently, the multiplexer may be implemented along the pipelined ADC depending on the requirements of the receiver.

Although the invention will be described throughout this disclosure with respect to wireless receivers, the invention may generally be applicable to any receiver application requiring well-matched sampling ADCs to digitize parallel data paths. The number of channels that may be combined or multiplexed is limited only by how fast the shared pipelined ADC may be clocked.

In one embodiment, the invention is directed to a method comprising receiving a signal, converting the signal into an analog in-phase (I) component and an analog quadrature (Q) component, and applying the analog I and Q components to a common analog-to-digital converter (ADC).

In another embodiment, the invention is directed to a communication device comprising a receiver that receives a signal, a down-converter that converts the signal into analog in-phase (I) and analog quadrature (Q) components, and a common analog-to-digital converter (ADC) that converts the analog I component to a digital I component and converts the analog Q component to a digital Q component.

In another embodiment, the invention is directed to a method comprising receiving a first signal, receiving a second signal, converting the first signal into a first analog in-phase (I) component and a first analog quadrature (Q) component, converting the second signal into a second analog in-phase (I) component and a second analog quadrature (Q) component, and applying the first analog I and Q components and the second analog I and Q components to a common analog-to-digital converter (ADC).

In another embodiment, the invention is directed to a device comprising a receiver that receives a first signal and a second signal, a downconverter that converts the first signal into a first analog in-phase (I) component and a first analog quadrature (Q) component and the second signal into a second analog I component and a second analog Q component, and a common analog-to-digital converter (ADC) that converts the first and second analog I components to corresponding first and second digital I components and converts the first and second analog Q components to corresponding first and second digital Q components.

The invention may offer one or more advantages. For example, unlike receivers that include independent ADCs for each parallel signal, the invention provides a receiver that includes a common ADC for the parallel signals. With respect to a 2-way ping-pong scheme, the analog I component and the analog Q component are multiplexed into the common pipelined ADC. Thus, any mismatch in the pipeline components is common to the I and Q components, thereby substantially eliminating many of the dominant mismatch effects, including static and time-varying mismatch effects. The two S/H circuits may also be positioned adjacent to each other on a circuit block to further minimize I-Q mismatch.

In addition, the receiver may have approximately a fifty percent savings in area because an extra ADC and associated external components may be eliminated. Accordingly, the receiver may achieve approximately a thirty to fifty percent reduction in power consumption. Further, clock routing may be simplified because clock paths need only be matched locally without having to control clock skews between independent ADCs.

The receiver may also include closed loop calibration techniques with improved accuracy and a reduced correction range to correct for I-Q mismatch in the preceding gain and filter stages. More specifically, because of the increased matching of digital I and Q components generated by the common ADC, the closed loop calibration techniques may exhibit improved accuracy and a reduced correction range.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
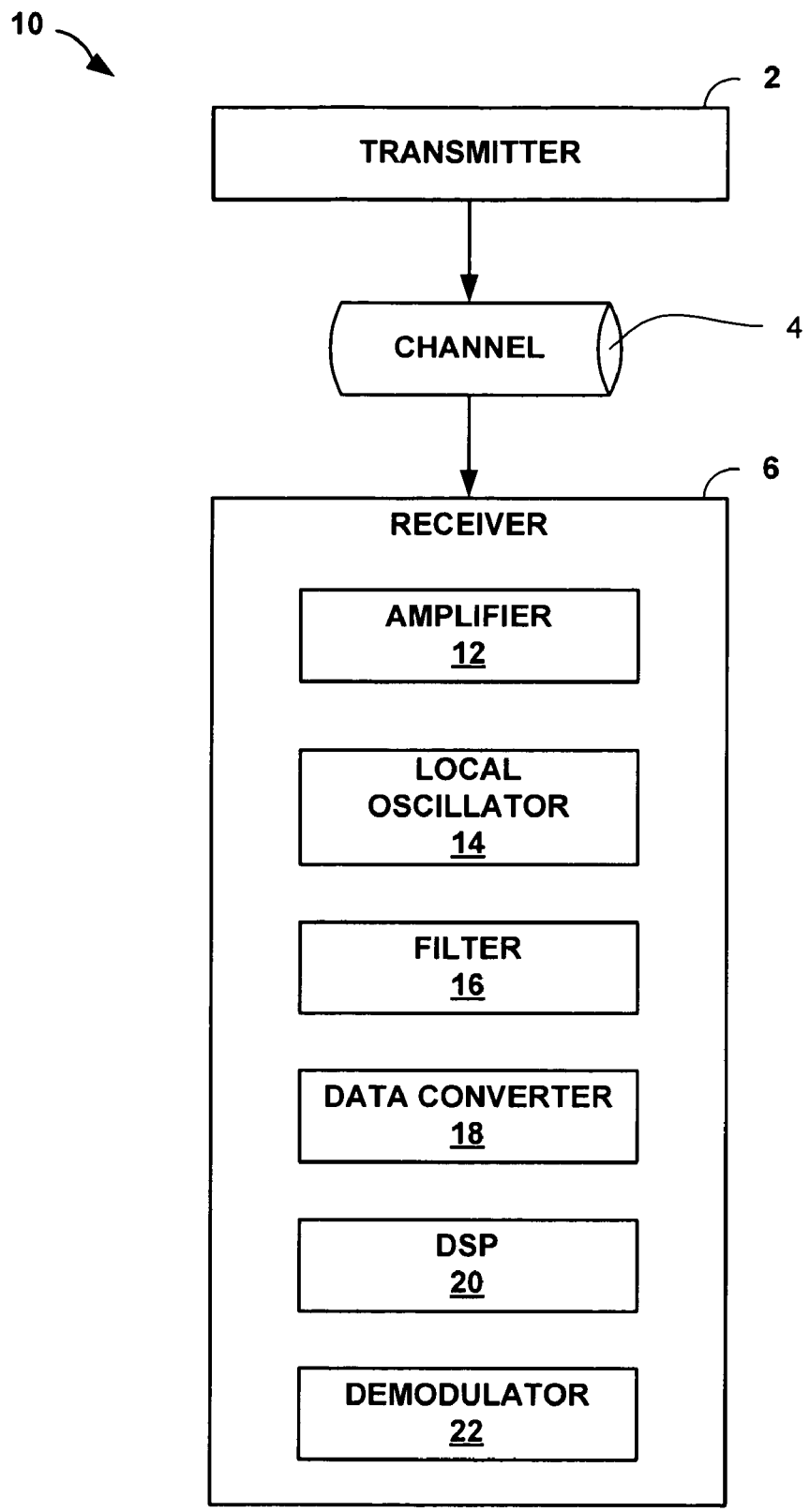
FIG. 1 is a block diagram illustrating an exemplary transmitter and receiver in a wireless communication system.

In general, the invention is directed to a receiver for use in a wireless communication system. The receiver substantially reduces or eliminates mismatch between an in-phase (I) component and a quadrature (Q) component of a received wireless signal. This is achieved by sharing or "pingponging" an analog-to-digital converter (ADC) between the analog I and Q components. By sharing a single pipelined ADC between the I and Q components, both the I and Q components are processed by the same circuitry inside the pipelined ADC, thereby eliminating many dominant sources of I-Q mismatch. Consequently, I-Q mismatch between the I and Q components, which negatively affects performance, may be substantially reduced. At the same time, system complexity and cost are reduced because the receiver uses a single ADC to process the I and Q components rather than using separate ADCs to process the I and Q components.

In contrast to typical receivers that use separate ADCs to convert the analog I and Q components to digital I and Q components using two parallel signal paths, the disclosure describes a receiver including a common ADC that converts the analog I component to a digital I component and the analog Q component to a digital Q component. Because both the I and Q components are processed by the same circuitry within the common ADC, the I and Q components experience the same imperfections and non-idealities. Consequently, mismatch between the digital I and Q components generated by the common ADC can be substantially reduced or eliminated.

In operation, the wireless signal is received at the antenna, amplified, translated to a lower frequency, filtered, and converted to the digital domain for further processing and demodulation. When the received wireless signal is translated or down-converted to a lower frequency, the receive path is split into two parallel paths. In particular, the signal may be down-converted using quadrature down-conversion to convert the signal into an I component and a Q component, of the received signal.

For example, the receiver includes a data converter to convert the received signal from the analog domain to the digital domain for signal processing and demodulation. The data converter includes first and second sample-and-hold (S/H) circuits, a multiplexer, and a common ADC. The first and second S/H circuits simultaneously sample channels I and Q, respectively, and may be positioned adjacent to each other on a circuit block to reduce mismatch between the S/H circuits. The multiplexer applies one of the outputs of the S/H circuits to the common ADC at a given time, i.e., on a time interleaved basis. In this manner, the ping-ponging of the common ADC between the I and Q components is achieved by the operation of the multiplexer. The common ADC comprises a pipelined ADC including a plurality of identical stages that each performs the same operation. Because the pipelined ADC processes the I and the Q components, the pipelined ADC operates at approximately twice the operating speed of the S/H circuits and the multiplexer. However, I-Q mismatch is substantially reduced because the I and Q components are processed using the same circuitry within the common ADC and an approximately fifty percent reduction in area may be achieved because an additional ADC and the external components associated with the additional ADC used by typical receivers is eliminated.

In addition to substantially reducing I-Q mismatch, the invention may also simplify clock routing. In particular, clock routing may be simplified because clock paths need only be matched locally without having to control clock skews between two independent ADCs. An approximately thirty to fifty percent reduction in analog power consumption may also be achieved due to the elimination of the additional ADC and associated external components. In this manner, the invention increases system performance while reducing system complexity, cost, power consumption, and die area.

The invention also may be extended to a 4-way ping-pong scheme and higher order ping-pong schemes. With respect to a 4-way ping-pong scheme, the invention may provide an approximately seventy-five percent savings in area compared to a receiver includes four independent, parallel ADCs. The invention also may extend to higher order ping-pong schemes, such as an 8-way ping-pong scheme, a 12-way ping-pong scheme, and the like.

In some embodiments, a switch network may be included upstream of the ping-pong scheme to eliminate mismatch effects due to mismatch in the S/H circuits. With respect to the 4-way ping-pong scheme, the switch network may rotate which input signal is sampled by a S/H circuit. The switch network may rotate the input signals according to a random control sequence. In this case, the same random sequence is applied to the output demultiplexer block to separate individual signal streams.

In additional embodiments, the most significant bits (MSB)s of the received signal may be computed using parallel signal paths and the least significant bits (LSB)s may be computed by multiplexing onto a single pipeline. In this case, the analog I and Q components may be applied to a first and a second ADC, respectively, at the same time to compute the MSBs. The output of the first and second ADCs may be multiplexed onto a common ADC that computes the LSBs. Consequently, the multiplexer may be implemented along the pipelined ADC depending on the requirements of the receiver.

Although the invention will be described throughout this disclosure with respect to wireless receivers, the invention may generally be applicable to any application requiring well-matched sampling ADCs to digitize parallel data paths. The number of channels that may be combined or multiplexed is limited only by how fast the shared pipelined ADC may be clocked.

FIG. 1 is a block diagram illustrating a wireless communication system 10 that substantially reduces or eliminates mismatch between and in-phase (I) component and a quadrature (Q) component of a received wireless signal. Reduction in mismatch is achieved by sharing or "ping-ponging" an analog-to-digital converter (ADC) between two parallel signal paths. Although the invention may generally be applicable to any application requiring well-matched sampling ADCs to digitize parallel data paths, application of the invention to wireless communication systems and, more particularly, receivers for use in wireless communication systems will be described throughout this disclosure.

System 10 includes a transmitter 2 that communicates with receiver 6 through wireless communication channel 4. Transmitter 2 may employ advanced signal modulation techniques to modulate the carrier frequency by a digital baseband signal. Transmitter 2 may, for example, utilize Phase-Shift Keying (PSK), Binary Phase Shift Keying (BPSK), Quadrature Phase Shift Keying (QPSK), Frequency Shift Keying (FSK), Minimum Shift Keying (MSK), and other modulation techniques. The use of digital modulation techniques versus analog modulation techniques leads to improved system performance, lower cost, higher reliability, greater capacity and increased security. However, these improvements come at the price of increased system complexity, particularly in the design of transceivers. In any case, transmitter 2 transmits the wireless signal over channel 4 which may induce multipath interference, intersymbol interference, fading, and other imperfections or non-idealities in the signal.

Receiver 6 receives the digitally modulated wireless signal and converts the received analog signal into a digital signal in order to perform digital signal processing to combat effects from channel 4 and demodulate the received signal in the digital domain. Receiver 6 includes an antenna (not shown), amplifier 12, local oscillator 14, filter 16, data converter 18, digital signal processor (DSP) 20, and demodulator 22. The wireless signal is received at the antenna (not shown), amplified by amplifier 12, translated to a frequency lower than the received signal by local oscillator 14, filtered by filter 16 to eliminate the image frequency and other harmonics generated by the frequency translation to a lower frequency, and converted from the analog domain to the digital domain by data converter 18 for digital signal processing and demodulation by DSP 20 and demodulator 22, respectively.

More specifically, amplifier 12 amplifies the received signal to compensate for signal loss over channel 4. Local oscillator 14 translates or down-converts the output of amplifier 12 to a frequency lower than the frequency of the received signal. For example, local oscillator 14 may comprise a quadrature tunable oscillator tuned to a fixed intermediate frequency or the baseband frequency. Accordingly, the received signal is split into two parallel paths, the I component and Q component of the received wireless signal, during the frequency translation, i.e., quadrature down-conversion.

The amount of gain and phase mismatch between the I and Q components is referred to as I-Q mismatch. I-Q mismatch negatively effects the performance of system 10 and, more particularly, receiver 6. The affect of I-Q mismatch generally depends on the receiver structure, e.g., heterodyne, homodyne, or image-reject. Receiver 6 may be implemented as a heterodyne, homodyne, or image reject receiver. Typically, image-reject and homodyne systems are more sensitive than heterodyne systems. In any case, I-Q mismatch leads to incomplete cancellation of the image frequency when channel I and channel Q are recombined in the digital domain. Incomplete cancellation of the image frequency degrades the signal-to-noise-ratio (SNR) in the desired frequency band and results in sub-optimal receiver performance.

The sources of mismatch between channel I and channel Q are many. For example, the gain and phase mismatch of local oscillator 14 contributes a mismatch term. Filter 16 and each stage in the two parallel signal paths of channels I and Q also contribute to the I-Q mismatch. While some sources of I-Q mismatch are static, others can vary over time, thereby making it more difficult to track and compensate for the mismatch. As an example, it may be particularly difficult to compensate for mismatch caused by ADCs in which the reference voltage mismatch changes as a function of operating temperature.

Unlike typical wireless receivers, which simultaneously process channels I and Q in two parallel, well-matched signal paths, receiver 6 shares a single ADC between the I and Q components. By sharing or ping-ponging the ADC between the I and Q components, I-Q mismatch is substantially reduced or eliminated. In order to clearly demonstrate the advantages of system 10 and, more particularly, wireless receiver 6, a description of the operation of a typical wireless receiver is provided below followed by a description of the operation of wireless receiver 6.

A typical wireless receiver commonly uses a data converter including a pipelined ADC for performing analog-to-digital conversion because pipelined ADCs are capable of high-speed operation while dissipating less power and occupying less area compared to other high speed architectures. In particular, the data converter generally includes a sample-and-hold (S/H) circuit, the pipelined ADC, and a timing controller. In operation, an analog input is applied to the S/H circuit. A sampling clock drives the timing controller, which controls the sampling rate and timing of the S/H circuit. The output of the S/H circuit is applied to the pipelined ADC. The pipelined ADC includes a plurality of identical stages that each performs the same operation. A single stage of the pipelined ADC includes an ADC, a DAC, an error summation circuit, and an amplifier. In general, the initial stage of the pipelined ADC receives an analog sample from the S/H circuit and applies the input to the ADC and the error summation circuit. The ADC outputs k digital bits and the DAC converts the digital output bits into a re-converted analog signal for application to the error summation circuit. The error summation circuit subtracts the re-converted analog signal from the originally sampled analog signal to produce an error signal that is applied to the amplifier. The next stage of the analog ADC receives the output of the amplifier as an input.

Because the received signal is converted into an I component and a Q component during frequency down-conversion to a lower frequency, independent ADCs are required to digitize each component. More specifically, in order to simultaneously process the I component and the Q component, a typical receiver utilizes two parallel, well-matched signal paths. Each signal path includes a filter, a data converter including an pipelined ADC, and DSP and demodulation circuitry. In this manner, a typical wireless receiver cancels unwanted by-products of the frequency down-conversion when the two components are recombined in the digital domain. However, the effectiveness of this cancellation scheme is fundamentally limited by the amount of I-Q mismatch in the two parallel signal paths. In other words, a typical wireless receiver experiences I-Q mismatch from the frequency down-conversion, the filter, and each stage of the pipelined ADC.

For example, matching two independent, data converters and, more particularly, pipelined ADCs, to each other is problematic. This is because each data converter comprises a complete system that is generally laid out as a monolithic block. As such, sensitive analog blocks that need to match e.g., the S/H circuit and amplifier, across data converters cannot usually be placed right next to each other. By physically interleaving two data converters and placing sensitive blocks adjacent to each other substantially eliminates mismatch between the data converters. However, physically interleaving two data converters increases the layout and routing complexity by approximately two-fold or more.

Other techniques for improving I-Q mismatch in two independent data converters require the use of larger device areas to minimize device mismatch. However, given the high-speed of operation required, use of larger device areas in the signal path of a data converter may not be feasible.

In the absence of larger device areas, closed-loop calibration techniques may be used to measure and compensate for gain and phase mismatch terms between two independent data converters. However, such closed loop calibration techniques involve added complexity and controls. In addition, most closed loop calibration techniques have a limited calibration range and are usually only activated in idle mode. As a result, any change in the operating point of the data converter between idle and normal modes is not calibrated.

In contrast to a typical wireless receiver, receiver 6 shares a single data converter and, more particularly, a single ADC, between the I and Q components of the received signal. By sharing a single ADC between between the I and Q components, the I and Q components are both processed by the same circuitry within the data converter thereby eliminating many dominant sources of I-Q mismatch. Consequently, wireless receiver 6 may achieve system performance while reducing system complexity, cost, power dissipation, and the number of external components for receiver 6. However, these improvements require that the analog pipeline and digital error correction circuitry operate at approximately twice the speed of the S/H circuits and multiplexer within the data converter.

For example, the invention may simplify clock routing because clock paths need only be matched locally without having to control clock skews between two independent data converters. In addition, the invention may result in approximately a fifty percent reduction in area because receiver 6 includes a single ADC rather than two independent ADCs. External components associated with the additional ADC are also eliminated. Receiver 6 may also achieve, in some embodiments, an approximately thirty to fifty percent reduction in analog power consumption due to the elimination of the additional ADC and associated external components.

Furthermore, because of the increased I-Q matching due to the common data converter, the digital I and Q components generate by the common data converter may, in some embodiments, be used to more accurately measure mismatch terms upstream in the signal path. Consequently, closed loop calibration techniques implemented to correct for I-Q mismatch in the preceding filter and gain stages may experience improved accuracy and a reduced correction range.

System 10 may comprise part of a wireless local area network (WLAN) configured to operate according to any of a variety of wireless networking standards, such as IEEE 802.11(a), (b), (e), (g), (n), or other standards. Consequently, transmitter 2 may include an antenna, amplifier, oscillator, baseband-to-RF up-converter, modem, and MAC layer components to output a wireless signal for transmission to receiver 6 over wireless communication channel 4. In some embodiments, receiver 6 may include more than one receive chain, e.g., for receive diversity. Accordingly, the ping-pong architecture may be provided in each receive chain in such embodiments.

Figure 2:
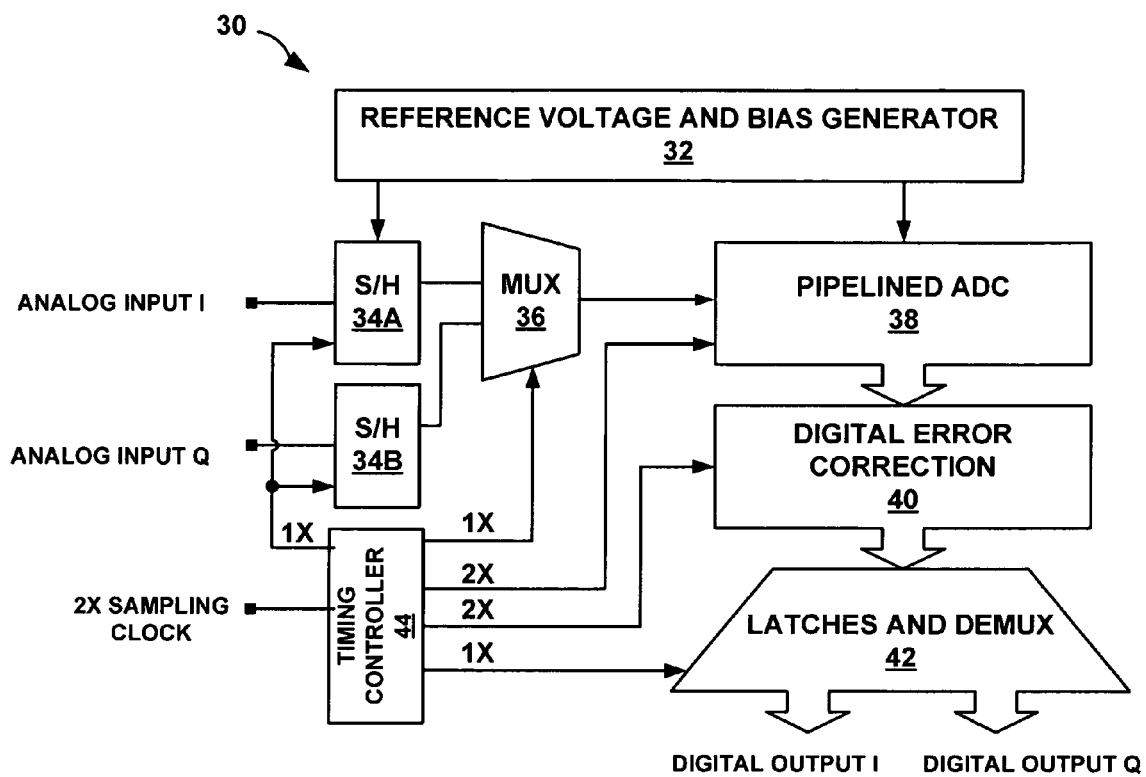
FIG. 2 is a block diagram illustrating a 2×1 ping pong analog-to-digital converter (ADC) of the receiver.
Figure 3:
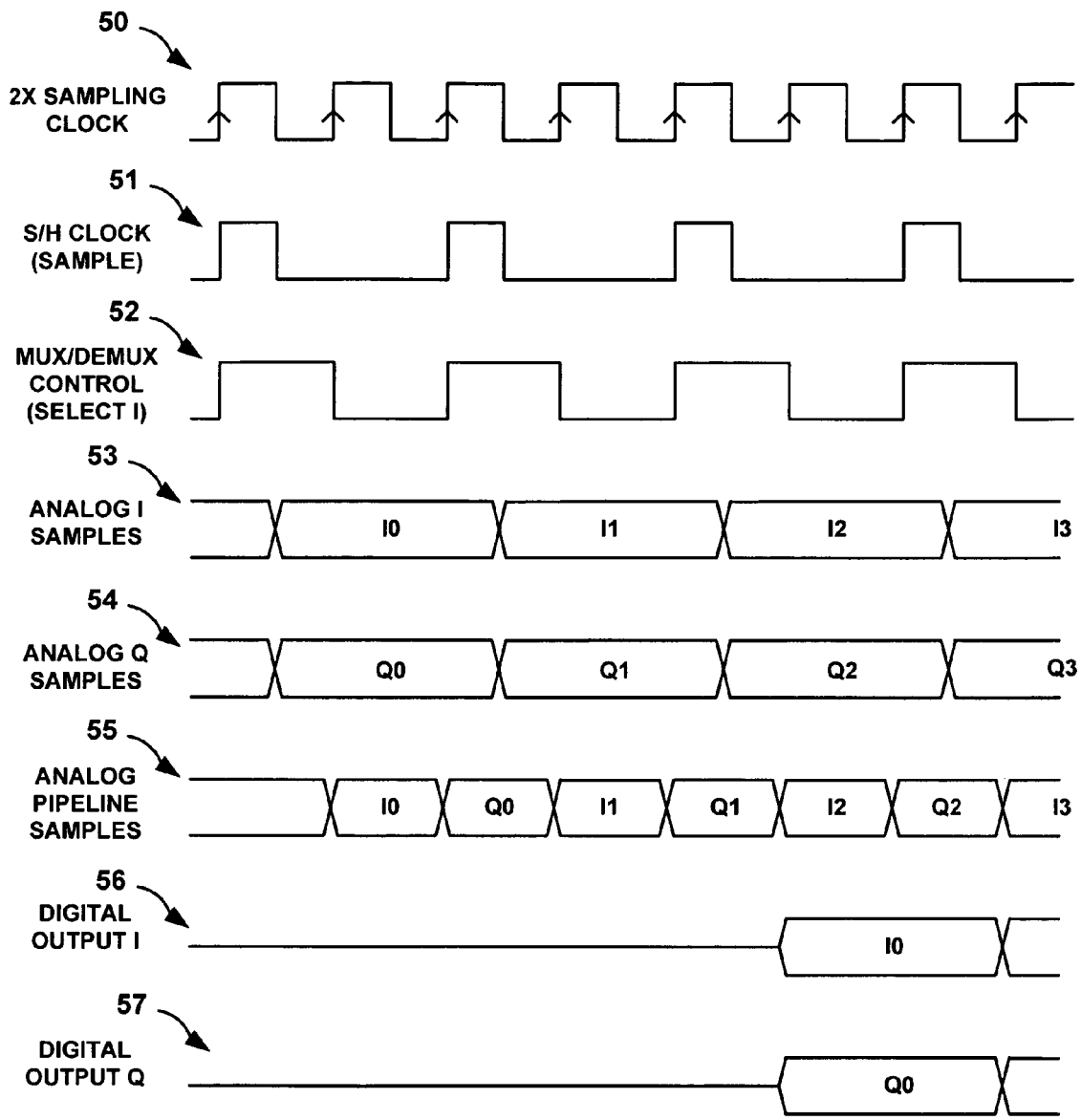
FIG. 3 illustrates timing waveforms for the pipelined 2×1 ping pong ADC.

FIG. 2 is a block diagram illustrating a data converter 30 with a 2×1 ping pong architecture. Data converter 30 may be similar to data converter 18 and suitable for use in receiver 6 to convert analog component I and analog component Q of received signal into digital output I and digital output Q, respectively. More specifically, because data converter 30 processes analog component I and analog component Q, the I-Q mismatch of digital outputs I and Q may be substantially reduced or eliminated. Timing waveforms for data converter 30 are illustrated in FIG. 3.

As shown in FIG. 2, data converter 30 includes reference voltage and bias generator 32, S/H circuits 34A and 34B (collectively referred to as "S/H circuits 34"), multiplexer (MUX) 36, pipelined ADC 38, digital error correction circuitry 50, latches and demultiplexer (DEMUX) circuitry 42, and timing controller 44. Reference voltage and bias generator 32 applies a reference voltage and bias to S/H circuits 34 and pipelined ADC 38. Analog component I and analog component Q are applied to S/H circuits 34A and 34B, respectively, under the control of timing controller 44. S/H circuits 34A and 34B sample analog component I and analog component Q at the same time. By sampling components I and Q at the same time, mismatch between the samples may be minimized. S/H circuits 34A, 34B may be positioned adjacent to each other on a circuit block in order to reduce mismatch.

Figure 5:
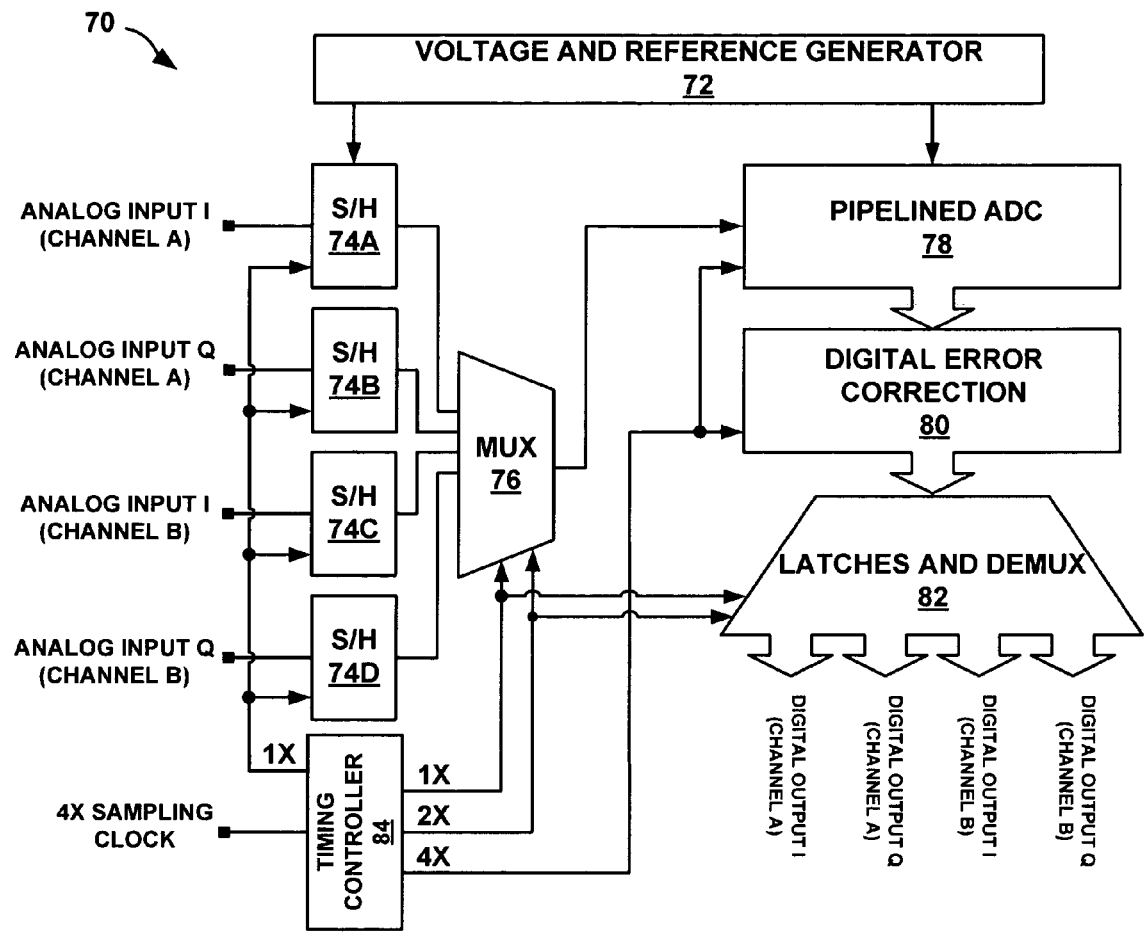
FIG. 5 is a block diagram illustrating a 4×1 ping pong ADC.
Figure 7:
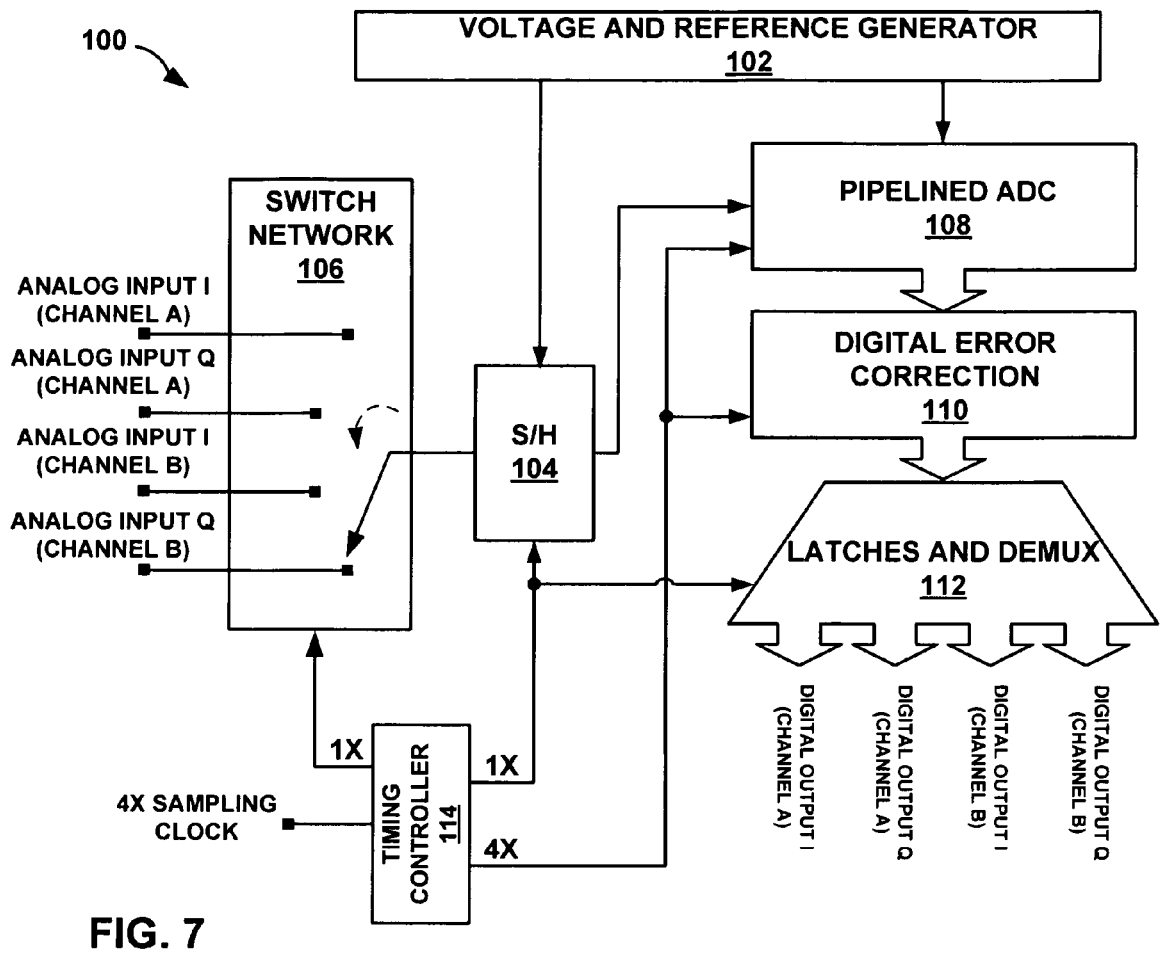
FIG. 7 is a block diagram illustrating a 4×1 ping pong ADC with a switching network.

MUX 36 selectively applies one of the outputs of S/H circuits to pipelined ADC at a given time, i.e., on a time interleaved basis. For example, MUX 36 may apply the output of S/H 34A to pipelined ADC 38 on a given clock cycle and apply the output of S/H 34B to pipelined ADC 38 on the following clock cycle. In general, MUX 36 may alternately apply the output of S/H circuits for every clock cycle. However, the invention is not limited to a 2×1 ping-pong architecture. Rather, the number of channels that may be combined or multiplexed is limited only by how fast pipelined ADC 38 can be clocked. Accordingly, in some embodiments, 4×1, 8×1, and similar ping-pong architectures may be provided. For example, FIGS. 5 and 7 illustrate two different 4×1 ping-pong architectures for a data converter that can be used by receiver 6.

As previously described, because pipelined ADC 38 is shared between analog component I and analog component Q, any imperfections or non-idealities resulting from components, i.e., each identical stage, within pipelined ADC 38 are common to channel I and channel Q. This includes static as well as time-varying non-idealities. In particular, channel I and channel Q both experience the same non-idealities caused by changes in the operating temperature of pipelined ADC 38. Since pipelined ADC is shared between both channels I and Q, pipelined ADC 38 operates at approximately twice the speed as the S/H circuits and MUX 36. Accordingly, FIG. 2 shows timing controller 44 driving pipelined ADC 38 at twice the speed as S/H circuits 34 and MUX 36.

Digital error correction circuitry 40 applies error correction techniques to the output of pipelined ADC 38. The error correction techniques may, for example, resolve imperfections caused by wireless communication channel 4, such as multipath interference, intersymbol interference, and fading. Digital error correction circuitry also operates at approximately twice the speed as S/H circuits 34 and MUX 36.

The DEMUX and latches block 42 outputs digital signal I and digital signal Q corresponding to analog component I and analog component Q, respectively. More specifically, the DEMUX portion of block 42 demultiplexes the output of digital error correction circuitry 40. Accordingly, the DEMUX of block 42 operates as the inverse of MUX 36. The latches of block 42 output digital signal I and digital signal Q at the same time. DEMUX and latches block 42 operates at the same speed as S/H circuits 34 and MUX 36. In this manner, digital signals I and Q are substantially well-matched and can be recombined in the digital domain. The recombined signal may be further processed and eventually demodulated. Because the mismatch between digital output signals I and Q may be substantially reduced, the performance of receiver 6 may be substantially improved because the image frequency may be more completely removed from the received signal.

FIG. 3 illustrates example timing waveforms for data converter 30. Timing waveform 50 illustrates the sampling clock waveform that timing controller 44 supplies to pipelined ADC 38 and digital error correction circuitry 40. Timing waveform 51 illustrates the sampling clock waveform that timing controller 44 supplies to S/H circuits 34, MUX 36, and DEMUX and latches block 42. As previously described, timing waveform 50 includes approximately two clock cycles per clock cycle of timing waveform 51. Timing waveform 52 illustrates the waveform that timing controller 44 supplies to MUX 36 and DEMUX and latches block 42.

Timing waveforms 53 and 54 illustrate the output of S/H circuits 34A and 34B, respectively. The output of timing waveforms 53 and 54 changes with the fall of each clock cycle of timing waveform 51. Timing waveform 55 illustrates the output of the initial stage of pipelined ADC 38. The output of timing waveform 55 transitions with the rise of each clock cycle of timing waveform 50.

Timing waveforms 56 and 57 illustrate digital output signals I and Q, respectively, at DEMUX and latch block 42. Timing waveforms 56 and 57 transition at the same time, i.e., corresponding to the fall of each clock cycle of timing waveform 52. Timing waveforms 56 and 57 do not include a sample until the third clock cycle of timing waveform 52 because MUX 36, pipelined ADC 38, and digital error correction circuitry 40 require three clock cycles to process the output of S/H circuits 34.

Figure 4:
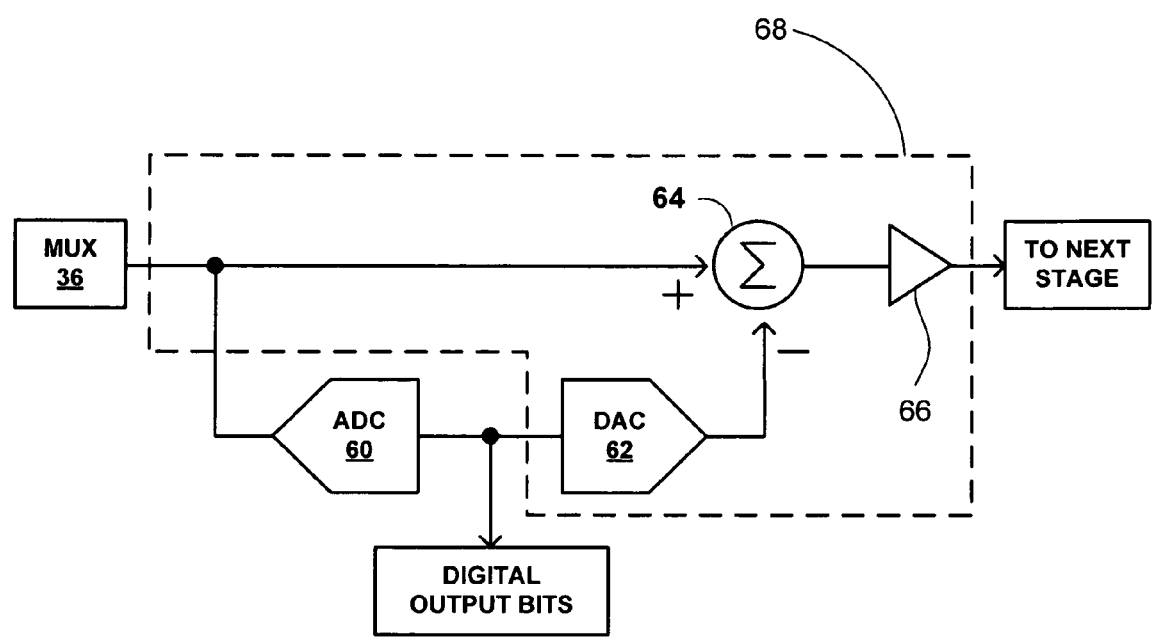
FIG. 4 is a block diagram illustrating one stage of the 2×1 ping pong ADC.

FIG. 4 is a block diagram illustrating the initial stage of pipelined ADC 38. In general, pipelined ADC 38 includes a plurality of identical stages that each perform the same operation. As shown in the illustrated example, the initial stage of pipelined ADC 38 includes ADC 60, DAC 62, error summation circuit 64, and amplifier 66. DAC 62, error summation circuit 64, and amplifier 66 may be implemented as a single circuit block. This block is commonly referred to as a multiplying DAC or MDAC 68.

Because FIG. 4 illustrates the initial stage of pipelined ADC 38, MUX 36 applies the input signal, i.e., one of analog component I and analog component Q, to ADC 60 and error summation circuit. ADC 60 outputs k digital bits, where k is a positive integer, to digital error correction circuitry 40. DAC 62 converts the k digital bits into a re-converted analog signal and applies the re-converted analog signal to error summation circuit 64. Error summation circuit 64 subtracts the re-converted analog signal from the originally sampled analog signal, i.e., output from MUX 36, to produce an error signal. The error signal is amplified by amplifier 66 and output to the next stage of pipelined ADC 38. In other words, stages located downstream from the illustrated initial stage receive the output of amplifier of the previous stage as an input. The output of the amplifier of the final stage may be discarded. Alternatively, the final stage of pipelined ADC 38 may only include an ADC.

FIG. 5 is a block diagram illustrating a data converter 70 with a 4×1 ping pong architecture, in which two different input signals, including two pairs of I and Q components, are processed by a common ADC. Data converter 60 may be suitable for use in receiver 6 to convert two received signals, e.g., signals received at two different antennas, into two corresponding digital signals. In the illustrated example, each received signal is converted into an analog I component and an analog Q component, resulting in four analog signal inputs to data converter 70. The two different received signals are identified by the channel on which the signal was received, i.e., channel A and channel B. Accordingly, the analog I component and analog Q component of the signal received on channel A are identified as analog components IA and QA, respectively. Similarly, the analog I component and analog Q component of the signal received on channel B are identified as analog components IB and QB, respectively.

As shown in FIG. 5, data converter 70 includes reference voltage and bias generator 72, S/H circuits 74A-D (collectively referred to herein as S/H circuits 74), MUX 76, pipelined ADC 78, digital error correction circuitry 80, DEMUX and latch block 82, and timing controller 84. Reference voltage and bias generator 72 applies a reference voltage and bias to S/H circuits 74 and pipelined ADC 78.

Analog IA component, analog QA component, analog IB component, and analog QB component are applied to S/H circuits 74A-D, respectively. S/H circuits 74 sample their respective inputs at the same time. Similar to S/H circuits 34, S/H circuits 74 may be also positioned adjacent to each other on a circuit block to minimize mismatch between the circuits.

MUX 76 selectively applies one of the analog components to pipelined ADC 78 at a given time, i.e., on a time interleaved basis. For example, MUX 76 may select which analog component to apply to pipelined ADC 78 according to a control sequence. In general, MUX 76 may apply the analog inputs in any order provided the order applies each analog component to pipelined ADC 78 once every four clock cycles. Importantly, the DEMUX of DEMUX and latch block 82 operates as the inverse of MUX 76.

In some embodiments, a data converter with a 4×1 ping-pong architecture may include a switch network and a single S/H circuit rather than four S/H circuits and a MUX. In such embodiments, the switch network rotates the S/H circuit to sample each of the four inputs in turn. Using a single S/H circuit eliminates another contribution to I-Q mismatch. FIG. 7 illustrates a data converter utilizing a single S/H circuit and a switch network.

With respect to FIG. 5, pipelined ADC 78 is shared between analog components IA, IB, QA, and QB. However, as previously described, pipelined ADC 78 may be constructed similar to pipelined ADC 38. In other words, pipelined ADC 78 includes a plurality of stages that each performs the same operation. However, unlike pipelined ADC 38, pipelined ADC 78 operates at approximately four times the speed of S/H circuits 74 and MUX 76.

Digital error correction circuitry 80 operates in a similar manner to digital error correction circuitry 40 of data converter 30, but operates at approximately the same speed as pipelined ADC 78. In other words, digital error correction circuitry 80 applies error correction techniques to the output of pipelined ADC 78 to combat imperfections in the received signal.

The DEMUX portion of DEMUX and latch block 82 demultiplexes the output of digital error correction circuitry 80. The DEMUX may be designed to operate as the inverse of MUX 76. The latches of block 42 output digital signals IA, IB, QA, and QB corresponding to analog components IA, IB, QA, and QB, respectively. In particular, the latches may output all the digital signals simultaneously so digital signals IA and QA and digital signals IB and QB can be recombined in the digital domain. DEMUX and latch block 82 operate at approximately the same speed as MUX 76, i.e., with the 2X clock, to de-interleave the digital signals. After the digital signals are de-interleaved, DEMUX and latch block 82 operate at approximately the same speed as S/H circuits 74, i.e., with the 1X clock, to re-align the digital signals As shown in FIG. 5, timing controller 84 supplies appropriate timing waveforms to S/H circuits 74, MUX 76, pipelined ADC 78, digital error correction circuitry 80, and DEMUX and latches block 82. A sampling clock (not shown) may drive timing controller 84. In general, the invention is not limited by the number of input channels. Rather the invention may only be limited by how fast the pipelined ADC can be clocked. In other words, as the number of channels increases, the number of S/H circuits can be proportionally increased, i.e., provided that chip area is unlimited. However, the speed at which the pipelined ADC can operate may become limited as the number of channels increases.

Figure 6:
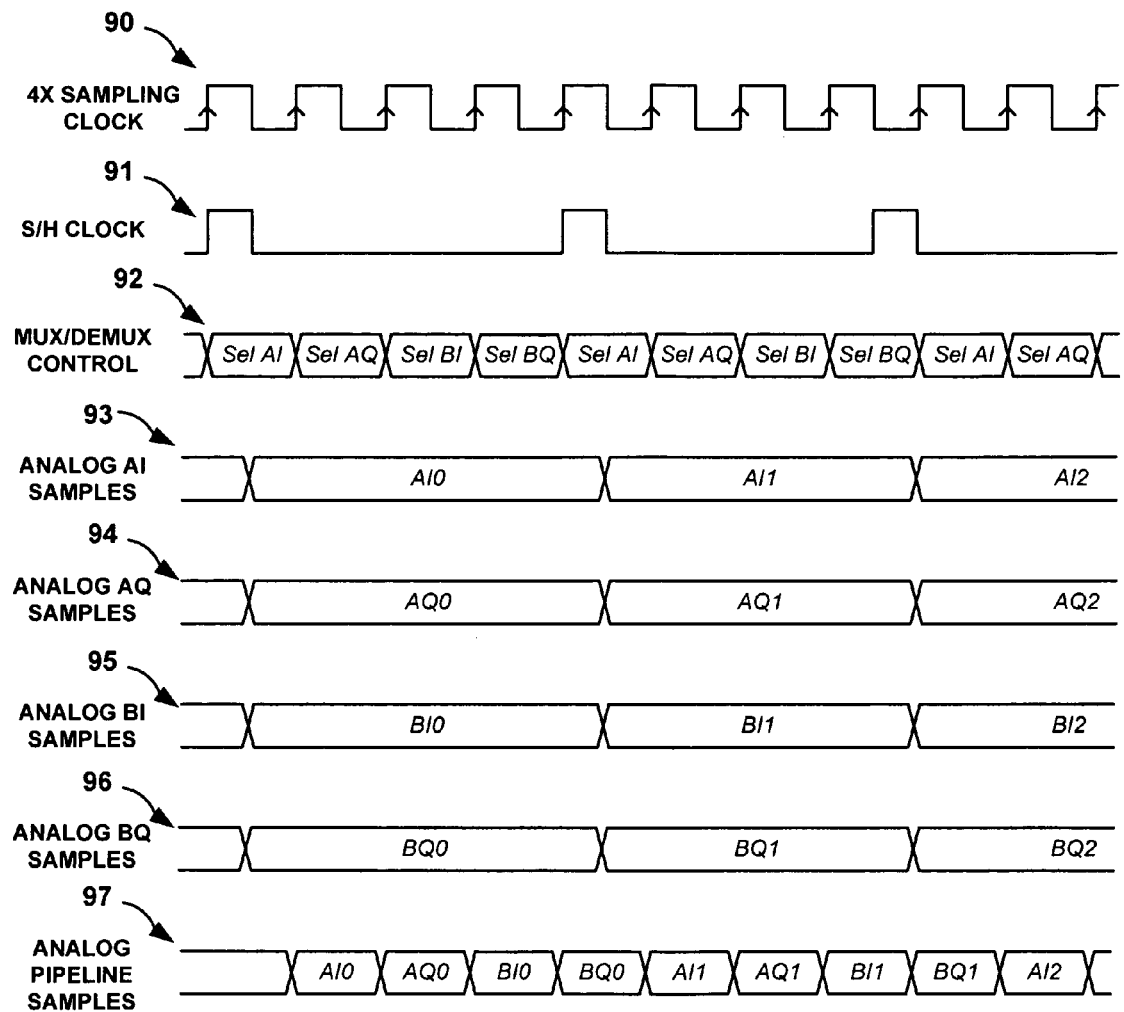
FIG. 6 illustrates timing waveforms for the 4×1 ping pong ADC.

FIG. 6 illustrates timing waveforms for data converter 70. Timing waveform 90 illustrates the sampling clock waveform that timing controller 84 supplies to pipelined ADC 78 and digital error correction circuitry 80. Timing waveform 91 illustrates the sampling clock waveform that timing controller 84 supplies to S/H circuits 74, MUX 76, and DEMUX and latches block 82. Timing waveform 90 has a clock rate approximately four times the clock rate of timing waveform 91. Timing waveform 92 illustrates the output of S/H circuits 74 selected by MUX 76. As shown in FIG. 6, MUX 76 selects the output of S/H circuits 74 according to the following order: S/H 74A, S/H 74B, S/H 74C, S/H 74D. MUX 76 selects the output of S/H circuits 74 corresponding to the rise of each clock cycle of timing waveform 90.

Timing waveforms 93-96 illustrate the output of S/H circuits 74A-D, respectively. Timing waveforms 93-96 show that S/H circuits 74A-D sample their respective inputs at the same time. More specifically, timing waveforms 93-96 change values corresponding to the fall of each clock cycle of timing waveform 91.

Timing waveform 97 illustrates the samples at the input of pipelined ADC 78. In the illustrated example, there is a one clock cycle delay between timing waveforms 92 and 97 because MUX 76 outputs its current sample one clock cycle after receiving the sample.

FIG. 7 is a block diagram illustrating another converter 100 with a 4×1 ping-pong architecture. Data converter 100 includes switch network 106, S/H circuit 104, reference voltage and bias generator 102, pipelined ADC 108, digital error correction circuitry 110, DEMUX and latches block 112, and timing controller 114. As shown in FIG. 7, data converter 100 may be suitable for use in receiver 6 to convert two received signals, e.g., signals received at two different antennas, into two corresponding digital signals. The analog signal components are identified in FIG. 7 with the same convention used for FIG. 5. However, unlike data converter 70 of FIG. 5, analog components IA, QA, IB, and QB are applied to switch network 106. Switch network 106 rotates which analog component is sampled by S/H circuit. Switch network 106 may select an analog component in accordance with a control sequence. In some embodiments, the control sequence may select each of the analog components in a pattern. The pattern may repeat for a given number of clock cycles so that each of the analog components is selected evenly. For example, the control sequence may select the analog components in the following order every four clock cycles: IA, QA, IB, QB. In alternative embodiments, the control sequence may select the analog components at random. In any case, DEMUX of block 112 operates as the inverse of switch network 106.

In this manner, S/H circuit 104 samples the applied input on a clock cycle and outputs the sample on the following clock cycle. By eliminating multiple S/H circuits, data converter 100 effectively eliminates I-Q mismatch that results from multiple S/H circuits. Consequently, the design of data converter 100 may be particularly advantageous for receivers with a large number of receive paths or channels.

S/H circuit 104 applies its output to pipelined ADC 108. Pipelined ADC 108, digital error correction circuitry 110, DEMUX and latches block 112, reference voltage and bias generator 102 operate in a similar manner as pipelined ADC 78, digital error correction circuitry 80, DEMUX and latches block 82, and reference voltage and bias generator 72 of FIG. 5. Timing controller 114 supplies pipelined ADC 108 and digital error correction circuitry 110 with a clock signal approximately four times the timing controller 114 supplies to switch network 106 and S/H circuit 104. Again, timing controller 114 may be driven by a sampling clock (not shown).

Data converter 100 may provide approximately a 75% area savings compared to typical receivers that simultaneously process the analog input components, IA, QA, IB, QB, using four independent, parallel ADCs because pipelined ADC 108 includes a single ADC that is shared between the analog components inputs. The invention, however, is not limited to 4 input channels. Rather, the invention may extend to a higher number of channels, e.g., 8, 10, and 12 channels. As previously described, in operation, the invention may only be limited by how fast pipelined ADC 108 can be clocked.

Figure 8:
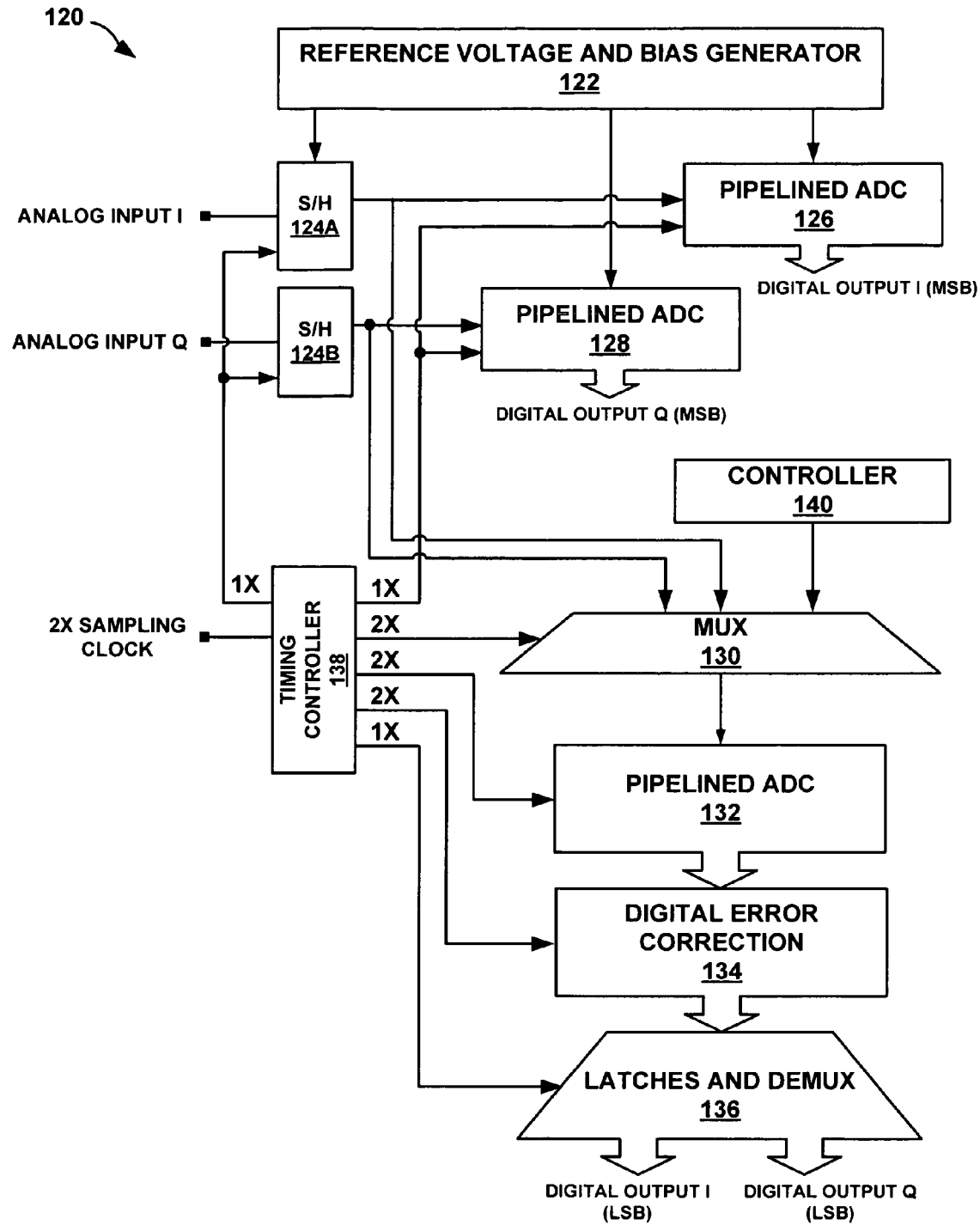
FIG. 8 is a block diagram illustrating a 2×1 ping pong ADC with the multiplexing circuit embedded deeper into the ADC.

FIG. 8 is a block diagram illustrating a data converter 120 suitable for use in receiver 6 and which may be particularly advantageous when higher sampling rates are required. In general, data converter 120 computes the most significant bits (MSB)s using parallel data paths and computes the least significant bits (LSB)s by ping-ponging a pipelined ADC between the outputs of the parallel signal paths. In other words, data converter 120 may be viewed as moving the ping-ponging step deeper into the pipelined ADC. At higher sampling rates, ping-ponging a pipelined ADC between inputs may cause the output of the ping-pong architecture to become unreliable. By computing the MSBs using parallel signal paths, the MSBs may be computed reliably. In contrast, computing the LSBs by ping-ponging the pipelined ADC between the inputs may result in a greater number of errors. However, a larger number of errors in the LSBs may be acceptable in some applications, particularly when a large savings in chip area can be achieved. Consequently, data converter 120 provides a tradeoff between performance and system complexity, cost, and power dissipation.

In the illustrated example, data converter 120 includes reference voltage and bias generator 122, S/H circuits 124A and 124B (collectively referred to as S/H circuits 124), pipelined ADC 126, pipelined ADC 128, MUX 130, pipelined ADC 132, digital error correction circuitry 134, DEMUX and latches block 136, timing controller 138, and controller 140. S/H circuits 124A and 124B sample the analog I component and analog Q component, respectively, of a received signal. Timing controller 138 controls the sampling rate and timing of S/H circuits 124. The output of S/H circuit 124A is applied to pipelined ADC 126 and the output of S/H circuit 124B is applied to pipelined ADC 128. As previously described in FIG. 1 with respect to typical pipelined ADCs, pipelined ADCs 126 and 128 each include a plurality of identical stages that each performs the same operation. In this manner, the front end of data converter 120 simultaneously processes parallel signal paths using two well-matched independent ADCs. Thus, pipelined ADCs 126 and 128 generate digital output bits I and Q which may be recombined, processed, and demodulated to compute the MSBs of the received signal. For purposes of illustration, only the output of pipelined ADCs 126 and 128 are shown. However, the output of pipelined ADCs 126 and 128 may be applied to additional circuitry for recombining, processing, and demodulating the received signal.

In addition to computing the MSBs of the received wireless signal using two well-matched parallel signal paths, data converter computes the LSB of the received signal by ping-ponging pipelined ADC 132 between analog I and Q components. Initially, data converter 120 determines when to apply the output of S/H circuits 124 to MUX 130. In the illustrated example, controller 140 determines when to apply the output of S/H circuits 124 to MUX 130 instead of pipelined ADCs 126 and 128. For example, controller 130 may include a counter that triggers controller 140 after a predetermined number of clock cycles.

In any case, after the MSBs have been computed, the output of S/H circuits 124 are applied to MUX 130. MUX 130 selectively applies one of the analog input components to apply to pipelined ADC 132 at a given time. Pipelined ADC 132 may operate in a manner similar to pipelined ADC 38. With respect to FIG. 8, pipelined ADC 132 operates at approximately twice the speed of S/H circuits 124, pipelined ADCs 126 and 128, MUX 130, and DEMUX and latches block 136. Digital error correction circuit 134 may operate similar to digital error correction circuit 40 of FIG. 1. DEMUX and latches block 138 applies digital error correction techniques to the output of pipelined ADC 132 and may operate similar to digital error correction circuit 40 of FIG. 1. DEMUX and latches block 42 generates digital output bits I and Q that can be used to compute the LSBs of the received signal.

Timing controller 138 supplies appropriate timing waveforms to S/H circuits 124, pipelined ADCs 126, 128, and 132, MUX 130, digital error correction circuit 134, and DEMUX and latches block 136. In general, pipelined ADC 132 and digital error correction circuitry 134 operate at approximately twice the speed of S/H circuits 124, pipelined ADCs 126 and 128, MUX 130, and DEMUX and latches block 136.

Figure 9:
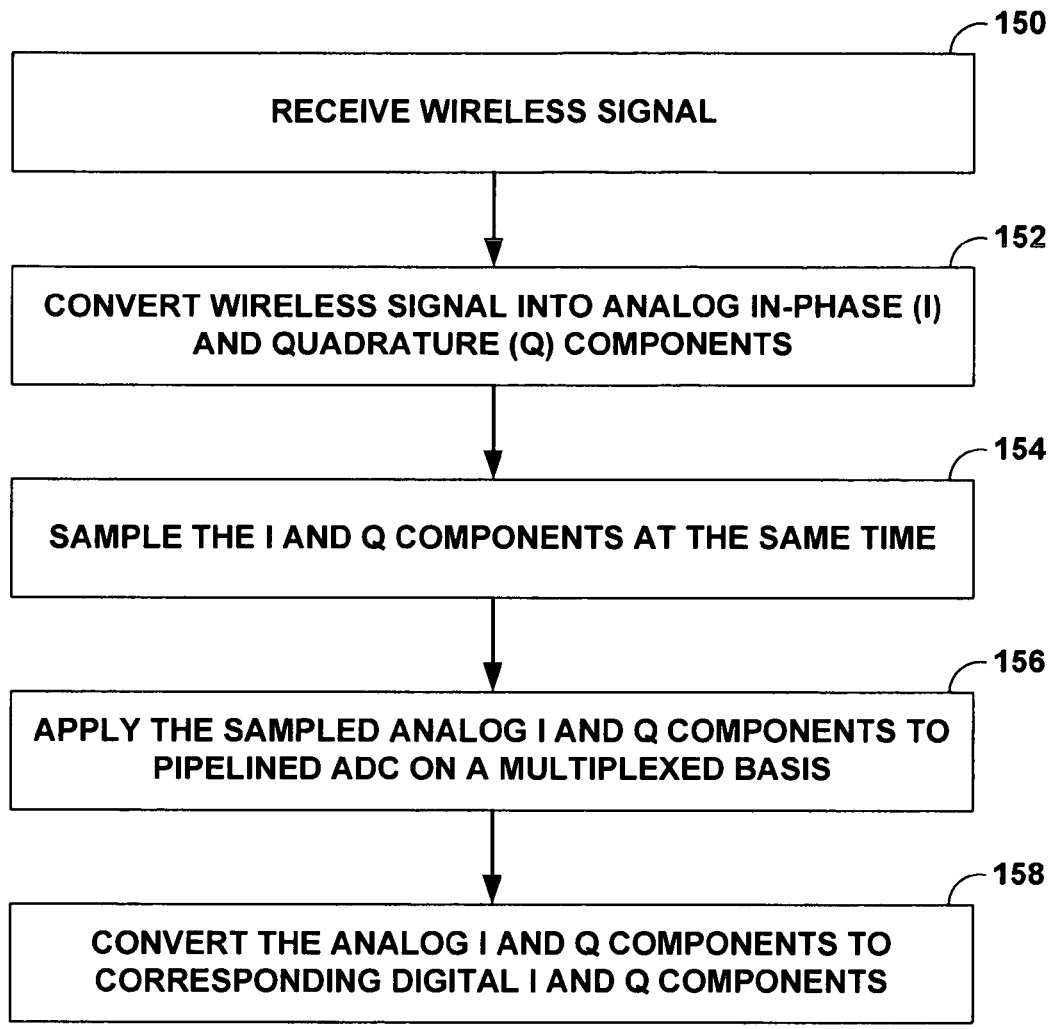
FIG. 9 is a flowchart illustrating exemplary operation of a receiver incorporating a ping pong ADC.

FIG. 9 is a flowchart illustrating exemplary operation of receiver 6 for substantially reducing or eliminating mismatch between I and Q components of a received wireless signal. For purposes of illustration, the flow chart depicted in FIG. 9 is described with reference to the exemplary structure illustrated in FIG. 2, i.e., data converter 30. Initially, a transmitter transmits a wireless signal using digital modulation techniques, such as PSK, BPSK, QPSK, FSK, and MSK. Receiver 6 receives the wireless signal (150) over a wireless communication channel and converts the received signal into an analog I component and an analog Q component (152). For example, receiver 6 may use a local oscillator to down-convert the received signal to a lower frequency. During the down-conversion, the wireless signal is converted into the analog I and Q components. The amount of gain and phase mismatch, i.e., I-Q mismatch, between the analog I and Q components at this point is determined by the local oscillator. The effect of I-Q mismatch on receiver 6 depends on the receiver structure, e.g., heterodyne, homodyne, or image-reject. In any case, I-Q mismatch leads to incomplete cancellation of the image frequency when the I and Q components are recombined in the digital domain, thereby degrading the SNR in the desired frequency band and causing sub-optimal receiver performance.

In order to substantially reduce I-Q mismatch between the I and Q components of the received signal, receiver 6 includes data converter 30 which converts the analog I and Q components into corresponding digital I and Q components. I-Q mismatch is substantially reduced or eliminated from the digital I and Q components output by data converter 30. Data converter 30 achieves this result by sampling the analog I and Q components of the received signal at the same time (152). In particular, timing controller 44 applies the same clock signal to S/H circuits 34A and 34B in order to cause receiver 6 to sample the I and Q components at the same time. S/H circuits 34 may also be positioned adjacent to each other on a circuit block to further reduce I-Q mismatch.

Receiver 6 also includes MUX 36 which applies the sampled I and Q components, i.e., the output of S/H circuits 34, to pipelined ADC 38 on a multiplexed basis (156). In other words, MUX 36 applies the output of one of S/H circuits to pipelined ADC 38 at a given time. With respect to FIG. 2, MUX 36 may, for example, apply the output of S/H circuit 34A to pipelined ADC 38 on a given clock cycle and apply the output of S/H circuit 34B to pipelined ADC 38 on the following clock cycle.

As previously described, pipelined ADC 38 converts the analog I and Q components to corresponding digital I and Q components (158). The I-Q mismatch between the digital I and Q components is substantially reduced or eliminated because the I and Q components are processed using the same circuitry, i.e., pipelined ADC 38, thereby eliminating many dominant sources of I-Q mismatch. In addition, any non-idealities or imperfections caused by pipelined ADC 38 are cancelled out when the digital I and Q components are combined.

Consequently, receiver 6 experiences improved performance while reducing system complexity, cost, power dissipation because a single pipelined ADC is shared between the I and Q components rather than simultaneously processing the I and Q components using parallel signal paths.

Various embodiments of the invention have been described. Although the invention is described throughout this disclosure with respect to wireless receivers, the invention may generally be applicable to any application requiring well-matched sampling ADCs to digitize parallel data paths. Further, the invention is not limited by the number of channels.

Various hardware components described herein may include one or more processors, e.g. one or more microprocessors, digital signal processors (DSP)s, application specific integrated circuits (ASICs), field-programmable gate arrays (FPGA)s, or other programmable logic circuitry, or any combination of the foregoing components.

In addition, in some cases, such components may execute program instructions stored within computer-readable media that cause them to perform the functions ascribed to them herein. Consequently, some embodiments take the form of a computer-readable medium comprising instructions that cause a programmable processor to perform various functions described herein. A computer-readable medium may be any electronic, magnetic, or optical medium, such as a random access memory (RAM), read-only memory (ROM), CD-ROM, hard or floppy magnetic disk, electronically erasable and programmable ROM (EEPROM), flash memory, or the like.

Various embodiments of the invention have been described. However, one skilled in the art will appreciate that various modifications or additions may be made to the described embodiments without departing from the scope of the claimed invention. These and other embodiments are within the scope of the following claims.

The invention claimed is:

1. A method comprising:
   receiving a signal;
   converting the signal into an analog in-phase (I) component and an analog quadrature (Q) component;
   sampling the analog I and Q components at substantially a same instance in time; and
   applying the sampled I and Q components to a common analog-to-digital converter (ADC) on a time interleaved basis, wherein the timing of the ADC is approximately twice the timing of the sampling of the analog I and Q components and the applying of the sampled I and Q components to the ADC.

2. The method of claim 1, wherein the signal is a wireless signal.

3. The method of claim 1, further comprising convening the analog I component to a digital I component and converting the analog Q component to a digital Q component, wherein the ADC converts the analog I and Q components to the corresponding digital I and Q components.

4. The method of claim. 1, wherein the ADC is a pipelined ADC, comprising a plurality of stages, each stage converting at least one bit from analog to digital.

5. The method of claim 4, further comprising, in each of the stages, converting an analog input into one or more digital bits, re-converting the digital bits into an analog signal, subtracting the analog signal from the analog input to produce an error signal, amplifying the error signal, and outputting the amplified error signal to a next stage of the ADC.

6. The method of claim 5, wherein the analog input comprises one of the analog I component, the analog Q component, and the amplified error signal of a previous stage of the ADC.

7. The method of claim 1, wherein applying the analog I and Q components includes multiplexing the analog I and Q components to apply one of the analog I and Q components to the ADC at a given time.

8. The method of claim 1, wherein applying the analog I and Q components includes applying the analog I component to a first ADC to convert the analog I component into a plurality of most significant bits (MSBs), applying the analog Q component to a second ADC at the same time to convert the analog Q component into a plurality of most significant bits (MSBs), and multiplexing the output of the first and second ADCs to apply one of the outputs to the common ADC at a given time, wherein the common ADC generates the least significant bits of the analog I and Q components.

9. The method of claim 1, wherein converting the signal comprises converting the signal into the analog I and Q components using quadrature down-conversion, the analog I and Q components having a frequency than the frequency of the received signal.

10. The method of claim 1, wherein receiving the signal includes amplifying and filtering the signal and applying the digital I and Q components to a closed loop calibration technique for correcting I-Q mismatch when amplifying and filtering the signal.

11. A communication device comprising:
a receiver that receives a signal;
a down-converter tat converts the signal into an analog in-phase (I) component and an analog quadrature (Q) component;
a first sample and hold (S/H) circuit to sample the analog I component;
a second S/H circuit to sample the analog Q component at substantially a same time the first S/H circuits samples the analog I component;
a common analog-to-digital converter (ADC) that converts the analog I component to a digital I component and converts the analog Q component to a digital Q component;
a multiplexer to apply one of the analog I and 0 components to the common ADC at a given time; and
a timing controller that controls the timing of the first and second S/H circuits, the multiplexer, and the common ADC, wherein the timing of the common ADC is approximately twice the timing of the multiplexer and the first and second S/H circuits.

12. The device of claim. 11, wherein the receiver is a wireless receiver and the signal is a wireless signal.

13. The device of claim 11, wherein the ADC is a pipelined ADC comprising a plurality of stages, each stage converting at least one bit from analoa to digital.

14. The device of claim 13, further comprising, in each stage, an ADC to convert an analog input into one or more digital bits, a digital-to-analog converter (DAC) to re-convert the digital bits into an analog signal, a summation circuit to subtract the analog signal from the analog input to produce an error signal, and an amplifier to amplify the error signal and output the amplified error signal to a next stage of the ADC.

15. The device of claim 14, wherein the analog input comprises one of the analog I component, the analog Q component and the amplified error signal of a previous stage of the ADC.

16. The device of claim 11, further comprising a multiplexer to apply one of the analog I and Q components to the ADC at a given time.

17. The device of claim 11, further comprising a first ADC to convert the analog I component into a plurality of most significant bits (MSfls) and a second ADG to convert the analog Q component into a plurality of MSBs.

18. The device of claim 17, further comprising:
a first ADC to generate the most significant bits (MSB)s of the analog I component; and
a second ADC to generate the MSBs of the analog Q component at the same time the first ADC generates the MSBs of the analog I component; wherein
the multiplexer applies one of the analog I and Q components to the common ADC at a given time, and further wherein
wherein the common ADC generates the least significant bits (LSB)s of the analog I and Q components.

19. The device of claim 11, wherein the first and second S/H circuits are positioned adjacent to each other on a circuit block.

20. The device of claim 11, wherein the down-converter converts the signal into analog I and Q components using quadrature down-conversion, the analog I and Q components having a frequency lower than the frdquency of the received signal.

21. The device of claim 11, further comprising:
an amplifier to amplify the received signal; and
a filter to filter the mirror frequencies resulting from downoonversion and output the analog I and Q components.

22. The device of claim 21, further comprising closed loop circuitry to correct I-Q mismatch in the amplifier and the filter.

23. A method comprising:
receiving a first signal;
receiving a second signal;
convening the first signal into a first analog in-phase (I) component and a first analog quadrature (Q) component;
converting the second signal into a second analog in-phase (I) component and a second analog quadrature (Q) component; and
applying the first analog I and Q components and the second analog I and Q components to a common analog-to-digital converter (ADC) on a time-interleaved basis, wherein only one of the first analog I component, the first analog Q component, the second analog I component and the second analog Q component is applied to the common ADC at a given time.

24. The method of claim 23, wherein the first and second signals are wireless signals.

25. The method of claim 23, further comprising converting the first and second analog I components to corresponding first and second digital I components and converting the first and second analog Q components to corresponding first and second digital Q components, wherein the ADC converts the first and second analog I components and the first and second analog Q components to the corresponding first and second digital I and Q components.

26. The method of claim 23, wherein the ADC is a pipelined ADC comprising a pluxality of stages, each stage convening at least one bit from analog to digital.

27. The method of claim 26, further comprising, in each stages, converting an analog input into one or more digital bits, re-converting the digital bits into an analog signal, subtracting the analog signal from the analog input to produce an error signal, amplifying the error signal, and outputting the amplified error signal to a next stage of the ADC.

28. The method of claim 27, wherein the analog input comprises one of the first analog I component, the second analog I component, ihe first analog Q component, the second analog Q component, and the amplified error signal of a previous stage of the ADC.

29. The method of claim 23, wherein applying the first and second analog I and Q components includes multiplexing the first and second analog I and Q components to apply one of the first analog I component, the first analog Q component, the second analog I component and the second analog Q component to the ADC at a given time.

30. The method of claim 23, wherein applying the first and second analog I and Q components includes sampling the first and second analog I and Q components at substantially a same time and applying the first analog I component, the first analog Q component, the second analog I component and the second analog Q component on a time interleaved basis.

31. The method of claim 23, wherein applying the first and second analog I and Q components includes selecting one of the first analog I component, the first analog Q component, the second analog I component and the second analog Q component to sample at a given time and applying the sample to the common ADC.

32. The method of claim 31, wherein selecting one of the first and second analog I and Q components comprises selecting one of the first analog I component, the first analog Q component, the second analog I component and the second analog Q component in accordance with a predetennined order.

33. The method of claim 31, wherein selecting one of the first and second analog I and Q components comprises randomly selecting one of the first analog I component, the first analog Q component, the second analog I component and the second analog Q component.

34. A device comprising:
a receiver that receives a first signal and a second signal;
a downconverter that converts the first signal into a first analog in-phase (I) component and a first analog quadrature (Q) component and converts the second signal into a second analog I component and a second analog Q component; and
a common analog-to-digital converter (ADC) that converts the first and second analog I components to corresponding first and second digital I components and converts the first and second analog Q components to corresponding first and second digital Q components, wherein the first and second analog I and Q components are applied to the common ADC on a time-interleaved basis such that only one of the first analog I component, the first analog Q component, the second analog I component and the second analog Q component is applied to the common ADC at a given time.

35. The device of claim 34, wherein the receiver is a wireless receiver and the signal is a wireless signal.

36. The device of claim 34, further comprising:
a first sample and hold (S/H) circuit to sample the first analog I component;
a second S/H circuit to sample the first analog Q component;
a third S/H circuit to sample the second analog I component;
a fourth S/H circuit to sample the second analog Q component, wherein each of the S/H circuits samples the respective component at a substantially a same instant in time; and
a multiplexer to apply one of the first analog I component, the first analog Q component, the second analog I component and the second analog Q component to the common ADO at a given time.

37. The device of claim 34, further comprising:
a multiplexer to select one of the first analog I component, the first analog Q component, the second analog I component and the second analog Q component to sample at a given time; and
a S/H circuit to sample the selected one of the first analog I component, the first analog Q component, the second analog I component and the second analog Q component, wherein the output of the S/H circuit is applied to the common ADC.

38. A device comprising:
a receiver that receives a signal;
a down-converter that converts the signal into an analog in-phase (I) component and an analog quadrature (Q) component;
a first analog-to-digital converter (ADC) to generate most significant bits (MSBs) of the analog I component;
a second ADC to generate MSBs oF the analog Q component at the substantially a same time the first ADC generates the MSBs of the analog I component;
a common ADC to generate least significant bits (LSBs) of the analog I component and the analog Q component; and
a multiplexer to apply one of the analog I component and Q component to the common ADC at a given time.

* * * * *

UNITED STATES PATENT AND TRADEMARK OFFICE
CERTIFICATE OF CORRECTION

PATENT NO. : 7,277,040 B2
APPLICATION NO. : 11/390991
DATED : October 2, 2007
INVENTOR(S) : Salman Mazhar It is certified that error appears in the above-identified patent and that said Letters Patent is hereby corrected as shown below:

On Column 16, line 43, (Claim 3), "convening" should read --converting--

On Column 17, line 34, (Claim 11), "0" should read --Q--

On Column 17, line 45, (Claim 13), "analoa" should read --analog--

On Column 17, line 63, (Claim 17), "(MSfls)" should read --(MSBs)--

On Column 17, line 63, (Claim 17), "ADG" should read --ADC--

On Column 18, line 7, (Claim 18), delete "wherein"

On Column 18, line 15, (Claim 20), "frdquency" should read --frequency--

On Column 18, line 20, (Claim 21), "downoonversion" should read --downconversion--

On Column 18, line 28, (Claim 23), "convening" should read --converting--

On Column 18, line 52 (Claim 26), "pluxality" should read --plurality--

On Column 18, line 53, (Claim 26), "convening" should read --converting--

On Column 18, line 55, (Claim 27), "stages" should read --stage--

On Column 18, line 63, (Claim 28), "ihe" should read --the--

UNITED STATES PATENT AND TRADEMARK OFFICE
CERTIFICATE OF CORRECTION

PATENT NO.       : 7,277,040 B2
APPLICATION NO.  : 11/390991
DATED            : October 2, 2007
INVENTOR(S)      : Salman Mazhar It is certified that error appears in the above-identified patent and that said Letters Patent is hereby corrected as shown below:

On Column 20, line 18, (Claim 36), "ADO" should read --ADC--

On Column 20, line 37, (Claim 38), "oF" should read --of--

Signed and Sealed this

Twelfth Day of August, 2008

JON W. DUDAS
*Director of the United States Patent and Trademark Office*